United States Patent
Tedrow et al.

(10) Patent No.: US 6,477,091 B2
(45) Date of Patent: Nov. 5, 2002

(54) METHOD, APPARATUS, AND SYSTEM TO ENHANCE NEGATIVE VOLTAGE SWITCHING

(75) Inventors: Kerry D. Tedrow, Folsom; Rajesh Sundaram, Fair Oaks, both of CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/823,463

(22) Filed: Mar. 30, 2001

(65) Prior Publication Data

US 2002/0141249 A1 Oct. 3, 2002

(51) Int. Cl.[7] .................................................. G11C 7/00
(52) U.S. Cl. .............................. 365/189.11; 365/185.18; 365/185.29
(58) Field of Search ..................... 365/189.11, 185.18, 365/185.29, 189.01, 185.01

(56) References Cited

U.S. PATENT DOCUMENTS

| | | |
|---|---|---|
| 5,043,940 A | 8/1991 | Harari |
| 5,163,021 A | 11/1992 | Mehrotra |
| 5,701,272 A | 12/1997 | Brennan, Jr. |
| 5,903,499 A | 5/1999 | Peng et al. |
| 6,091,618 A | 7/2000 | Fazio et al. |
| 6,151,255 A | 11/2000 | Joo et al. |
| 6,160,735 A | 12/2000 | Hirano |
| 6,166,961 A * | 12/2000 | Lee et al. .............. 365/185.18 |
| 6,166,968 A | 12/2000 | Song |

OTHER PUBLICATIONS

INTEL®, 1.8 Volt Intel®Wireless Flash Memory, Specification Update, Dec. 2000, pp. 17.
INTEL®, 1.8 Volt Intel®Wireless Flash Memory (W18), Preliminary Datasheet, Jan. 2001, pp. 84.
INTEL®, 3 Volt Fast Boot Block Flash Memory, Jan. 2000, pp. 51.

* cited by examiner

Primary Examiner—Hoai Ho
(74) Attorney, Agent, or Firm—Blakely, Sokoloff, Taylor & Zafman LLP

(57) ABSTRACT

The present invention is in the field of flash memory. More particularly, embodiments of the present invention may provide a negative voltage for erasing when coupled to a memory cell to be erased and provide voltages to read or program when not coupled to a memory cell that is selected to be erased. Embodiments may also provide a high magnitude negative voltage to erase; a low impedance, low voltage current to read or program; and burn little to no current when not coupled to a memory cell that is selected to be erased.

30 Claims, 6 Drawing Sheets

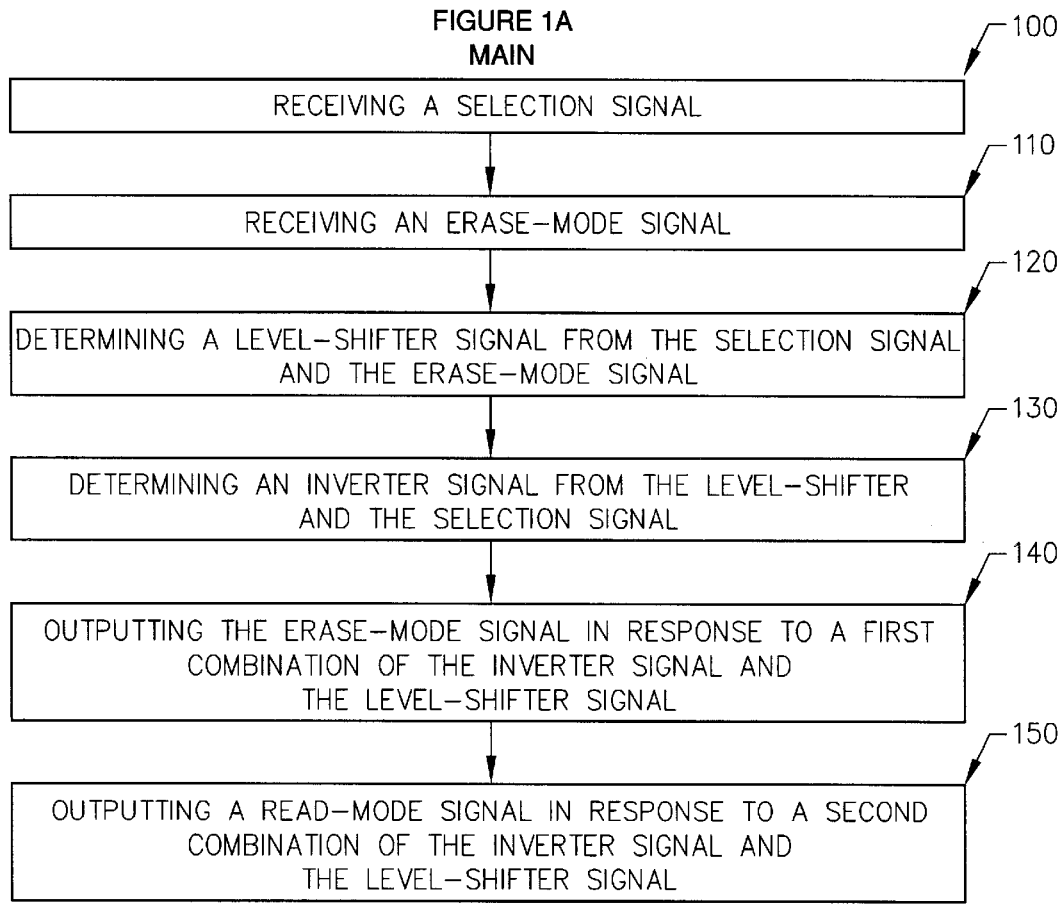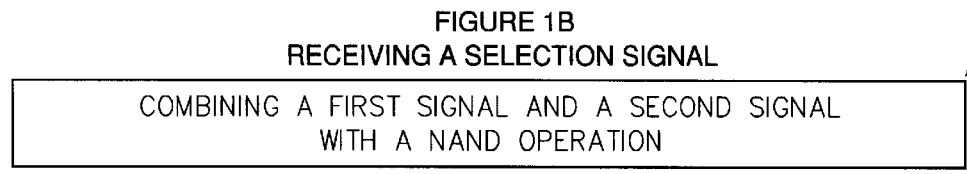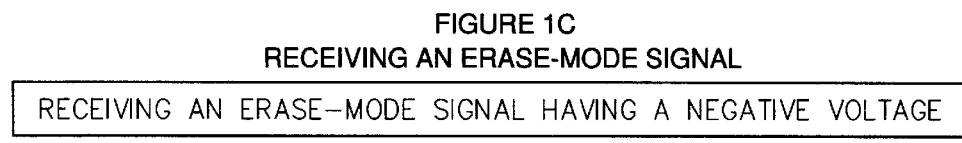

Figure 4:
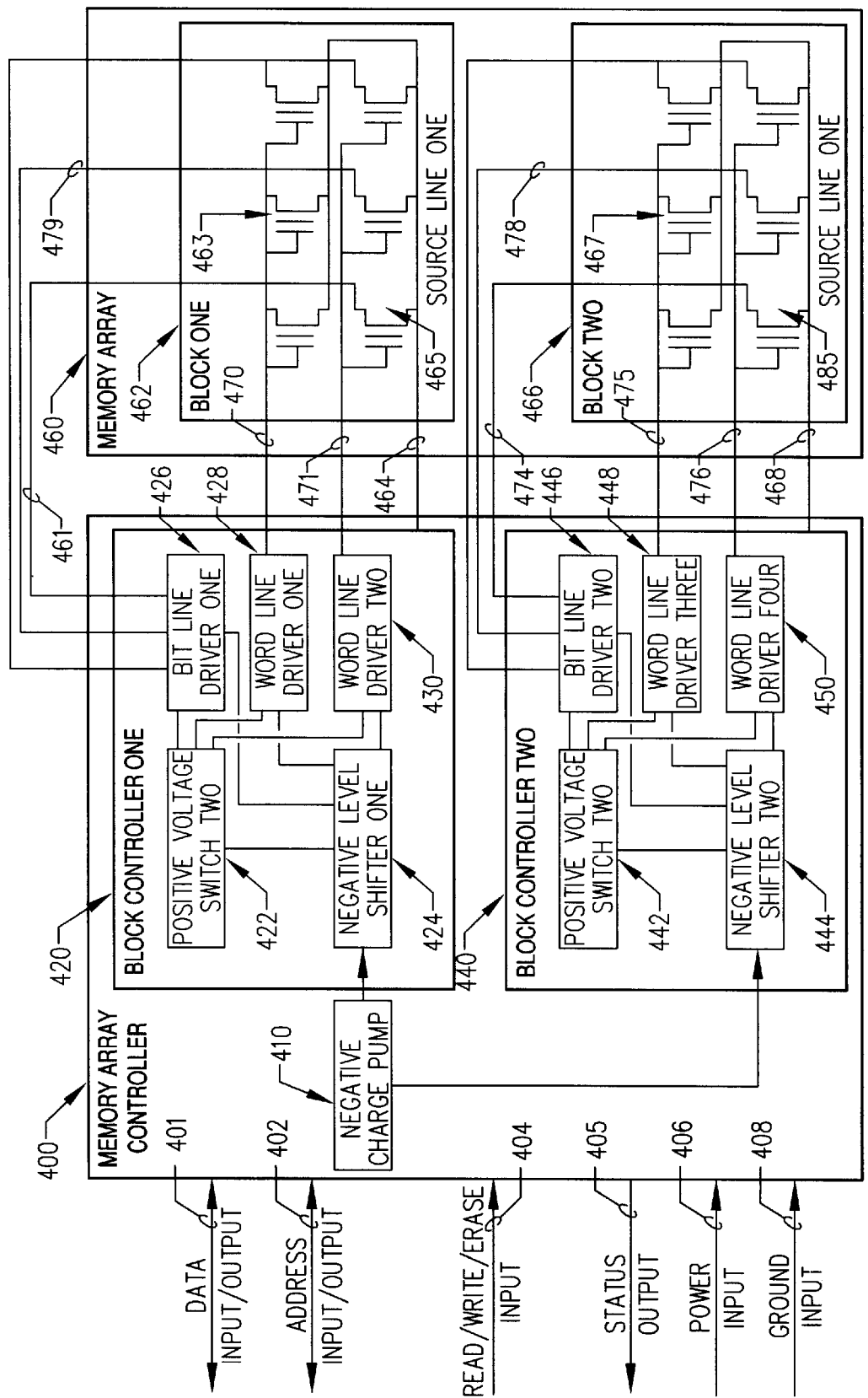

FIGURE 1D
DETERMINING A LEVEL-SHIFTER SIGNAL FROM THE SELECTION
SIGNAL AND THE ERASE-MODE SIGNAL ⸺125

| PULLING UP A VOLTAGE FROM A NEGATIVE ERASE-MODE VOLTAGE |

FIGURE 1E
DETERMINING AN INVERTER SIGNAL FROM THE LEVEL-SHIFTER SIGNAL ⸺135
AND THE SELECTION SIGNAL

| CHOOSING BETWEEN THE LEVEL-SHIFTER SIGNAL AND THE SELECTION SIGNAL |

FIGURE 1F
OUTPUTTING THE ERASE-MODE SIGNAL IN RESPONSE TO A FIRST
COMBINATION OF THE INVERTER SIGNAL AND
THE LEVEL-SHIFTER SIGNAL ⸺145

| OUTPUTTING THE ERASE-MODE SIGNAL IN RESPONSE TO A POSITIVE VOLTAGE INVERTER SIGNAL AND A NEGATIVE VOLTAGE LEVEL-SHIFTER SIGNAL |

FIGURE 1G
OUTPUTTING A READ-MODE SIGNAL IN RESPONSE TO A SECOND
COMBINATION OF THE INVERTER SIGNAL AND
THE LEVEL-SHIFTER SIGNAL ⸺155

| OUTPUTTING THE READ-MODE SIGNAL IN RESPONSE TO A NEGATIVE VOLTAGE INVERTER SIGNAL AND A NEGATIVE VOLTAGE LEVEL-SHIFTER SIGNAL |

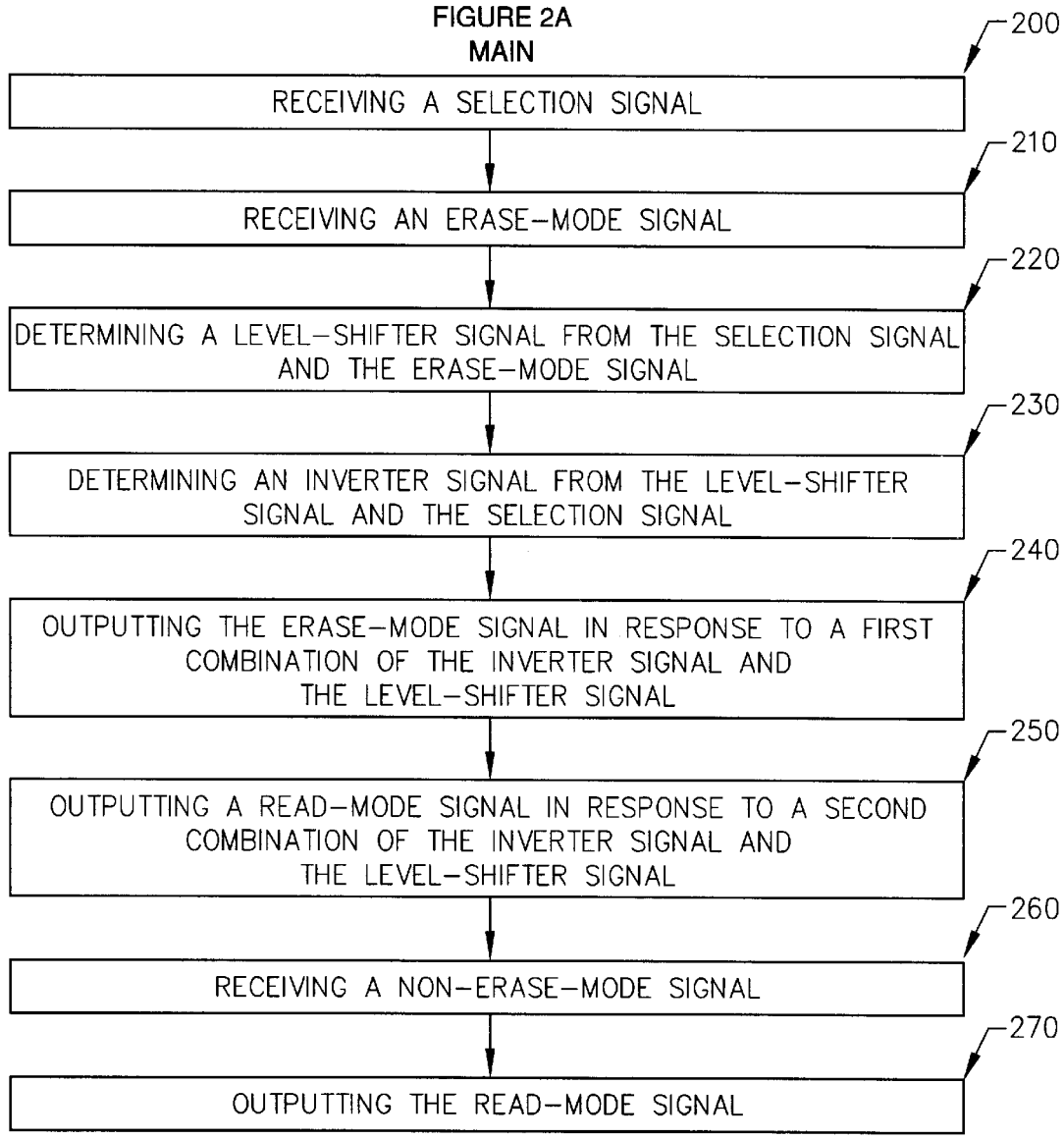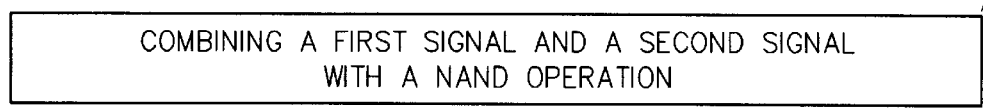

FIGURE 2C
RECEIVING AN ERASE-MODE SIGNAL  ⟋ 215

| RECEIVING AN ERASE-MODE SIGNAL HAVING A NEGATIVE VOLTAGE |
|---|

FIGURE 2D
DETERMINING A LEVEL-SHIFTER SIGNAL FROM THE SELECTION SIGNAL AND THE ERASE-MODE SIGNAL  ⟋ 225

| PULLING UP A VOLTAGE FROM A NEGATIVE ERASE-MODE VOLTAGE |
|---|

FIGURE 2E
DETERMINING AN INVERTER SIGNAL FROM THE LEVEL-SHIFTER SIGNAL AND THE SELECTION SIGNAL  ⟋ 235

| CHOOSING BETWEEN THE LEVEL-SHIFTER SIGNAL AND THE SELECTION SIGNAL |
|---|

FIGURE 2F
OUTPUTTING THE ERASE-MODE SIGNAL IN RESPONSE TO A FIRST COMBINATION OF THE INVERTER SIGNAL AND THE LEVEL-SHIFTER SIGNAL  ⟋ 245

| OUTPUTTING THE ERASE-MODE SIGNAL IN RESPONSE TO A POSITIVE VOLTAGE INVERTER SIGNAL AND A NEGATIVE VOLTAGE LEVEL-SHIFTER SIGNAL |
|---|

FIGURE 2G
OUTPUTTING A READ-MODE SIGNAL IN RESPONSE TO A SECOND COMBINATION OF THE INVERTER SIGNAL AND THE LEVEL-SHIFTER SIGNAL  ⟋ 255

| OUTPUTTING THE READ-MODE SIGNAL IN RESPONSE TO A NEGATIVE VOLTAGE INVERTER SIGNAL AND A NEGATIVE VOLTAGE LEVEL-SHIFTER SIGNAL |
|---|

FIGURE 2H
OUTPUTTING THE READ-MODE SIGNAL  ⟋ 275

| SUPPLYING A LOW IMPEDANCE, LOW VOLTAGE CURRENT |
|---|

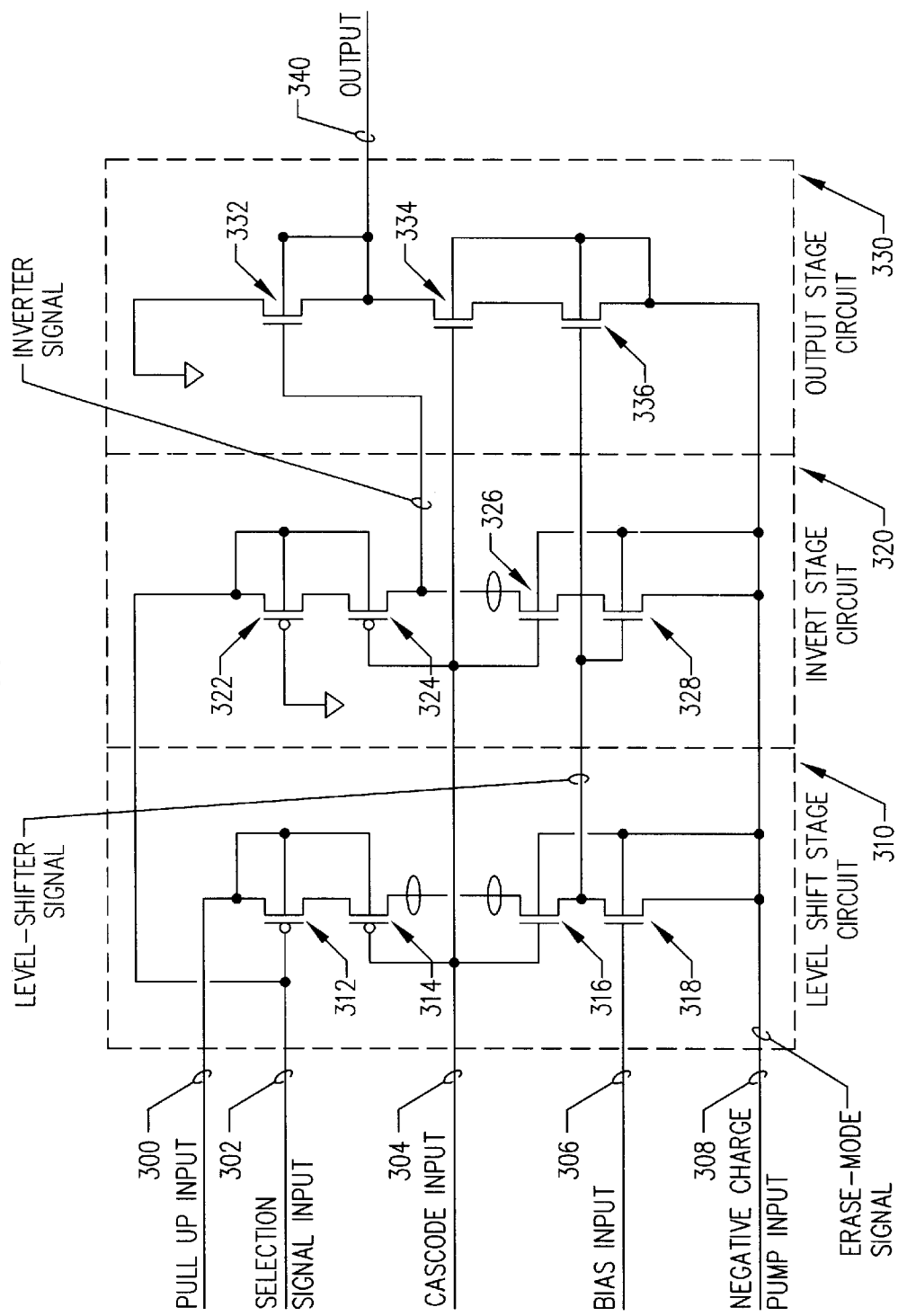

METHOD, APPARATUS, AND SYSTEM TO ENHANCE NEGATIVE VOLTAGE SWITCHING

FIELD OF INVENTION

The present invention is in the field of flash memory. More particularly, the present invention provides a method, apparatus, and system to enhance negative voltage switching.

BACKGROUND

The design of memory support circuitry can determine the competitiveness of a memory device. Memory must be fast, low power, and physically compact data storage to remain competitive. Memory access time is a measure used to how fast the memory is and can be based on the speed of operations such as programming, erasing, and reading. These operations, in turn, can be limited by the physical configuration of the memory. In flash memory, for example, memory cells are transistors and the transistors are typically organized in blocks having rows and columns. Transistors in a row may have their gates coupled to a conductor called a word line. The sources of these transistors may be coupled to a source line. Transistors in a column may have their drains connected in columns by bit lines, but usually not to drains of transistors in the same row. Further, a number of these rows and columns of memory cells are divided into blocks. Source lines may describe blocks because all the source lines in a block may be coupled such that a voltage applied to the source line is applied to the source of all the memory cells in that block. Since alternate transistor configurations may switch the roles of the drain and source in any type of circuitry, drain/source sometimes refers to a first element of a transistor coupled to the transistor's channel and source/drain refers to a second element coupled to the other side of that transistor's channel. Programming, erasing, and reading are limited by this physical configuration because voltages applied to one memory cell are also applied to other memory cells in the block. Thus, to perform an operation on a memory cell, a process called latching selects the memory cell by applying program-mode, erase-mode, or read-mode signals to the selected memory cell and applying signals to deselected memory cells to prevent corruption of their contents.

Programming a memory cell refers to storing a charge on a capacitance of the memory cell. The amount of charge on the capacitance can be directly related to the threshold voltage of the memory cell. In flash memory, for example, the transistors have a capacitance in the form of floating gates separated from the gate and the substrate by dielectric layers. When a memory cell is selected for programming, an address indicating the physical location of the selected memory cell is transmitted to a memory array controller. The memory array controller also receives data to program into the selected memory cell. The memory array controller can latch the selected memory cell, applying program-mode signals to the selected word line, source line, and bit line coupled to the memory cell such as twelve, zero, and seven volts, respectively. Program-mode signals are typically voltages that may be applied to a memory cell so the memory cell can be programmed. Program-mode voltages can vary depending upon the design of a memory cell and the memory array configuration. Then, the memory array controller can program the selected memory cell by applying a voltage pulse to the selected bit line, e.g. the drain/source. Voltage pulses applied to the drain/source cause a charge to build up on the floating gate. The floating gate is charged by hot electron injection or by hot hole injection when a voltage pulse is applied to the drain/source. Since programming requires voltages on the bit line (a column) and the word line (a row), a single transistor can be latched and programmed.

Unlike programming, selecting memory cells to be erased is typically done by selecting rows of memory cells because erasing can be performed by applying an erase-mode signal having a negative word line to source line voltage. Erase-mode signals supply a voltage and sometimes a current, both of which may vary in accordance with memory cell attributes and the memory array configuration, and are designed to reduce a charge on a memory cell. Some memory configurations remove charges by applying zero volts to the word line and twelve volts to the source line of the selected memory cells. In many transistors, applying more than twelve volts to the source line can place the transistor in a break down mode, a mode that is detrimental to the lifetime cycles of the memory. However, greater voltage differences between the selected word line and the source line accomplished with a negative voltage on the selected word line can remove the charge from the floating gates more quickly without causing the transistors to move into a break down mode. Therefore, other memory designs employ a negative voltage switch to apply a negative voltage to the selected word line.

Reading a selected memory cell, when the memory cell is a transistor, may be accomplished by applying read-mode signals and comparing a current between the drain and source of the transistor to a reference. Read-mode signals may comprise one volt applied to the selected bit line, five volts applied to the selected word line and zero volts applied to the selected source line.

A negative charge pump, negative voltage switch, and positive voltage switch can supply the signals for selected and deselected memory cells. A negative charge pump may supply an erase-mode signal to the negative voltage switch when a block coupled to the negative charge pump comprises a selected memory cell to erase. A positive voltage switch may supply a normal operating voltage to the negative voltage switch. The negative voltage switch is typically coupled to a word line driver and can either provide the erase-mode signal to a memory cell selected for erasure or the normal operating voltage to memory cells not selected for erasure. Although negative voltage switches can supply the voltages to the selected and deselected memory cells, the negative charge pump, when used in conjunction with these negative voltage switches, can limit the size and operation of the storage devices. First, negative charge pumps may be limited to supply currents in the range of 50 microamperes since larger currents require more layout area and more power consumption. Several of the negative voltage switches coupled to these negative charge pumps use power when supplying voltages to deselected memory cells, limiting the memory device to a maximum data storage capacity. For example, a negative charge pump limited to 50 microamperes may supply up to 25 blocks of deselected memory cells if each negative voltage switch burned two microamperes. Second, negative voltage switches may not support alternate memory operations such as providing a read-mode signal for reading while receiving a negative voltage for erasing, or providing a read-mode signal for reading while providing a program-mode signal for programming. Finally, some of these negative voltage switches are limited to supply a low magnitude, negative voltage for erasing.

BRIEF FIGURE DESCRIPTIONS

The accompanying drawings, in which like references indicate similar elements, show:

FIGS. 1a–g Flowchart of an embodiment of the present invention.

FIGS. 2a–h Alternative flowchart of an embodiment of the present invention.

FIGS. 3–4 Example apparatus embodiments of the present invention.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated for the present invention are too numerous to discuss individually so the detailed descriptions below are designed to make such embodiments obvious to a person of ordinary skill in the art.

In particular, the following describes method, apparatus, and system embodiments to enhance a negative voltage switching, identified as a negative level shifting for clarity. This negative level shifting can replace the negative voltage switching and solve or attenuate many of the problems or limitations discussed above in regards to negative voltage switches. Referring to FIGS. 1a–g, an example flowchart of an embodiment is shown. This embodiment comprises receiving a selection signal 100, receiving an erase-mode signal 110, determining a level-shifter signal from the selection signal and the erase-mode signal 120, determining the inverter signal from the level-shifter signal and the selection signal 130, outputting the erase-mode signal in response to a first combination of the inverter signal and the level-shifter signal 140, and outputting a read-mode signal in response to a second combination of the inverter signal and the level-shifter signal 150. Receiving a selection signal 100 may comprise combining a first signal and a second signal with a nand operation 105. Combining a first signal and a second signal with a nand operation 105 can comprise receiving a first signal such as a normal operating voltage like 3.6 volts when erasing a memory cell within a memory array or a low voltage like zero volts when not erasing a memory cell within the memory array. Combining a first signal and a second signal with a nand operation 105 can further comprise receiving a second signal such as a the normal operating voltage when erasing a memory cell within a block of the memory array or a low voltage like zero volts when not erasing a memory cell within the block of the memory array. For example, combining a first signal of a normal operating voltage, 3.6 volts, with a second signal of 3.6 volts can result in the selection signal of zero volts, indicating a selected block in a selected memory array during erase-mode. Alternatively, if combining a first signal of 3.6 volts and a second signal of zero volts, the resulting signal may be 3.6 volts, indicating a deselected block in a selected memory array for erasing a memory cell.

Receiving an erase-mode signal 110 comprises receiving an erase-mode signal having a negative voltage 115. Receiving an erase-mode signal having a negative voltage 115 may comprise receiving a negative voltage to facilitate a quick erasure of a memory cell. Applying a negative voltage to the gate of the memory cell increases the break down mode voltage of the gate-to-source junction. For instance, a memory cell may have a gate-to-source break down mode voltage of 12 volts if zero volt is applied to the gate and 12 volts is applied to the source. However, the gate-to-source break down mode voltage may be over 15.5 volts if a negative voltage of a magnitude greater than 3.5 volts is applied to the gate. A high potential difference between the gate and the source can be achieved without going into gate-to-source break down mode by applying a high magnitude negative voltage to the gate. Thus receiving a negative voltage to facilitate a quick erasure of a memory cell may comprise receiving a voltage of negative 12.5 volts. Determining a level-shifter signal from the selection signal and the erase-mode signal 120 can comprise pulling up a voltage from a negative erase-mode voltage 125. Pulling up a voltage from a negative erase-mode voltage 125 is designed to change the mode of a transistor such as from on to off or from off to on. In the present embodiment of the invention, pulling up a voltage from a negative erase-mode voltage 125 comprises turning on one or more transistors to couple a voltage via the channel of the one or more transistors to a node coupled to an erase-mode voltage to create a level-shifter signal.

Referring now to FIGS. 1a and 1e–1g, determining the inverter signal from the level-shifter signal and the selection signal 130 is designed to facilitate a selection of an output signal in the present embodiment and can comprise choosing between the level-shifter signal and the selection signal 135. Choosing between the level-shifter signal and the selection signal 135 may comprise arranging one or more transistors to turn on or off in response to the level-shifter signal and arranging one or more transistors to turn on or off in response to the selection signal. Outputting the erase-mode signal in response to a first combination of the inverter signal and the level-shifter signal 140 is designed to output the erase-mode signal to erase a selected memory cell within the selected block of the memory array and comprises outputting a negative erase-mode voltage in response to a positive voltage inverter signal and a negative voltage level-shifter signal 145. In the present embodiment, outputting a negative erase-mode voltage in response to a positive voltage inverter signal and a negative voltage level-shifter signal 145 comprises turning off a transistor with the inverter signal, such as negative 12.5 volts, and turning on a second transistor with a negative level-shifter signal, e.g. negative six volts, such that the erase-mode signal is applied to the output of the negative level shifter via a channel of the second transistor. Outputting a negative erase-mode voltage in response to a positive voltage inverter signal and a negative voltage level-shifter signal 145 may also comprise arranging transistors to perform steps of the present embodiment such that only a single transistor conducts current from the source of the erase-mode signal. Finally, outputting a read-mode signal in response to a second combination of the inverter signal and the level-shifter signal 150 may output the read-mode signal received to facilitate a read of a memory cell within the block of the of the memory array and comprises outputting the read-mode voltage in response to a negative voltage inverter signal and a negative voltage level-shifter signal 155. Outputting the read-mode voltage in response to a negative voltage inverter signal and a negative voltage level-shifter signal 155 can comprise turning on a transistor with a positive inverter signal voltage, such as 3.6 volts, such that a read-mode voltage, such as zero volts, is applied to the output via a low resistance channel of the transistor. Further, outputting the read-mode voltage in response to a negative voltage inverter signal and a negative voltage level-shifter signal 155 may turn off a second transistor with a negative level-shifter voltage, such as negative 12.5 volts.

In some embodiments, outputting a negative erase-mode voltage in response to a positive voltage inverter signal and a negative voltage level-shifter signal 145 comprises turning off a transistor with the inverter signal to remove the read-mode signal from the output. These embodiments may also comprise a cascode transistor between a low voltage and the transistor to split the potential difference between the transistor and the cascode transistor. In many of these embodiments, the cascode transistor is bypassed when applying the read-mode signal to the output of the negative level shifter to reduce the resistance between the low voltage and the output. Further, outputting a high magnitude negative voltage may be limited only by the gate-to source break down mode voltage of the transistor or of the transistor in combination with cascode transistors.

Referring now to FIGS. 2a–h, an example flowchart of the embodiment is shown. This embodiment comprises receiving a selection signal 200, receiving an erase-mode signal 210, determining a level-shifter signal from the selection signal and the erase-mode signal 220, determining the inverter signal from the level-shifter signal and the selection signal 230, outputting the erase-mode signal in response to a first combination of the inverter signal and the level-shifter signal 240, outputting a read-mode signal in response to a second combination of the inverter signal and the level-shifter signal 250, receiving a non-erase-mode signal 260, and outputting the read-mode signal 270. Receiving a selection signal 200 is designed to determine when a memory cell within the array is going to be erased and whether the memory cell is within a block. Receiving a selection signal 200 may comprise combining a first signal and a second signal with a nand operation 205. Combining a first signal and a second signal with a nand operation 205 can produce a high or low voltage output dependent upon whether a memory cell within the array is going to be erased and whether the memory cell is within the block. Combining a first signal and a second signal with a nand operation 205 can comprise receiving a first signal that may be either a normal operating voltage when a memory cell selected to be erased is within the memory array or a low voltage when no memory cell in the memory array is to be erased; and receiving a low voltage when the memory cell to be erased is not within a block of the memory array. Then, for example, combining the normal operating voltage with the normal operating voltage to obtain the selection signal can result in a low voltage, indicating that a selected memory cell is within the block. Alternatively, if combining a first signal of normal operating voltage, and a second signal of low voltage, the resulting signal may be the normal operating voltage, indicating that the selected memory cell is in another block of the memory array. Receiving an erase-mode signal 210 comprises receiving an erase-mode signal having a negative voltage 215. In several embodiments, receiving an erase-mode signal having a negative voltage 215 can comprise receiving a negative voltage from a negative charge pump. Determining a level-shifter signal from the selection signal and the erase-mode signal 220 may comprise pulling up a voltage from a negative erase-mode voltage 225. Pulling up a voltage from a negative erase-mode voltage 225 may turn a transistor on such that a voltage is transmitted via the channel of the transistor and the channel of a cascode transistor to a node. This transmission may increase the voltage at the node from an erase-mode voltage to generate a level-shifter signal.

Referring now to FIGS. 2a and 2e–2g, determining the inverter signal from the level-shifter signal and the selection signal 230 can select the output signal and can comprise choosing between the level-shifter signal and the selection signal 235. Choosing between the level-shifter signal and the selection signal 235 comprises arranging a first transistor coupled to the erase-mode signal to turn on in response to the level-shifter signal and arranging a second transistor to turn off in response to the selection signal, coupling the erase-mode to a node via the first transistor's channel and decoupling the selection signal from the node with the second transistor to create an inverter signal. In addition, choosing between the level-shifter signal and the selection signal 235 may comprise arranging a first transistor coupled to the erase-mode voltage to turn off in response to the level-shifter signal and arranging a second transistor to turn on in response to the selection signal, decoupling the erase-mode voltage from a node via the first transistor's channel and coupling the selection signal to the node to create an inverter signal. Outputting the erase-mode signal in response to a first combination of the inverter signal and the level-shifter signal 240 can output the erase-mode signal and comprises outputting the erase-mode voltage in response to a positive voltage inverter signal and a negative voltage level-shifter signal 245. In the present embodiment, outputting an erase-mode voltage in response to a positive voltage inverter signal and a negative voltage level-shifter signal 245 can comprise turning off a transistor with the inverter signal, such as negative 10 volts, and turning on a second transistor with a negative voltage level-shifter signal such that the erase-mode signal is applied to the output of the negative level shifter via a channel of the second transistor. And arranging the negative level shifter such that only approximately one microampere of current from the negative charge pump is burned, such as by a long channel transistor. Outputting a read-mode signal in response to a second combination of the inverter signal and the level-shifter signal 250 can increase the efficiency of a flash memory device by allowing a read of a memory cell within the block of the negative level shifter when a memory cell in a different block is being erased. For example, erasing and programming of memory cells can take several cycles so flash memory typically accepts a command to erase or program a memory cell and performs the erasing or programming as background operations. Thus, when a command to read a memory cell is received while erasing or programming, the present embodiment can service the read command in many instances without interrupting the erasing or programming operation. Outputting a read-mode signal in response to a second combination of the inverter signal and the level-shifter signal 250 comprises outputting the read-mode voltage in response to a negative voltage inverter signal and a negative voltage level-shifter signal 255. Outputting the read-mode voltage in response to a negative voltage inverter signal and a negative voltage level-shifter signal 255 can comprise turning on a transistor with a positive inverter signal voltage such that a read-mode voltage is applied to the output via a low resistance channel of the transistor and turning off a second transistor with a negative voltage level-shifter signal.

Referring now to FIGS. 2a and 2h, several embodiments comprise receiving a non-erase-mode signal 260 and outputting the read-mode signal 270. Receiving a non-erase-mode signal 260 is designed to place the negative level shifter in a non-erase-mode. Outputting the read-mode signal 270 is designed to further improve the speed of flash memory by facilitating a read in the block coupled to the negative level shifter while a reading or programming is being performed in the same or different block and can comprise supplying a low impedance, low voltage current 275. Supplying a low impedance, low voltage current 275 may comprise, for example, supplying a zero voltage current via a low resistance channel of a transistor.

Several embodiments of the invention do not burn current from a negative charge pump while negative level shifting for a block with no memory cell to be erased. Burning current from the negative charge pump while negative level shifting for a deselected block can either limit the number of deselected blocks that can be supplied by the negative charge pump or increase the current requirements of the negative charge pump.

Referring to FIG. 3, an embodiment for an apparatus to enhance negative voltage switching is shown, referred to as a negative level shifter for clarity. The present embodiment can comprise a level shift stage circuit 310, an invert stage circuit 320 coupled to the level shift stage circuit 310, and an output stage circuit 330 coupled to the invert stage circuit 320. The level shift stage circuit 310 can comprise an active pull-up stage circuit comprising a p-channel transistor 312 having a source coupled to a pull-up input 300, an inverted gate coupled to a selection signal input 302, a bulk coupled to the pull-up input 300, and a drain coupled to the source of a cascode transistor 314. The bulk of a transistor in the present embodiment is a fourth connection point coupled to the substrate of the transistor on the opposite side of the channel from the drain, source, and gate. When the bulk is floated, the voltage is typically zero volts but stress on the transistor between the bulk and the drain, source, and gate can be reduced by changing the voltage of the bulk. The cascode transistor 314 is designed to reduce the stress of the active pull-up transistor 312 and comprises a ringed drain, i.e. gate physically encircles the drain to reinforce the electric field between the drain and the bulk of the cascode transistor 314. The ringed drain can increase the break down mode voltage characteristic of the cascode transistor 314. The cascode transistor 314 also has a bulk coupled to the bulk of the active pull-up transistor 312, an inverted gate coupled to a cascode input 304 and a ringed drain coupled to a ringed drain of a second cascode transistor 316. The second cascode transistor 316 is part of a current source pull-down stage circuit. The cascode input 304 can turn on and off cascode transistors 314, 316, 324, 326, and 334. The current source pull-down stage circuit can comprise a triple well, n-channel, insulated gate transistor for a cascode transistor 316 having a gate coupled to the cascode input 304, a bulk coupled to the bulk of a current source pull-down transistor 318, and a source coupled to the drain of the current source pull-down transistor 318. The current source pull-down transistor 318 can be designed as part of a current mirror circuit to pull-down the voltage at the drain of the current source pull-down transistor 318. The current source pull-down transistor 318 can comprise a triple well, long, n-channel transistor. The current source pull-down transistor 318 can have a source and a bulk coupled to negative charge pump input 308 and a gate coupled to a bias input 306 to keep the transistor on, even during transitions between erase-mode of a deselected block to an erase-mode with a selected block. For example, in the present embodiment, transistors 322, 324, and 326 may be turned on in the transition between selected block and deselected block when applying an erase-mode voltage to the output 340. If the current source pull-down transistor 318 is turned off, the transistor 328 may remain on and a current would be conducted between the selection signal input 302 and the negative charge pump input 308. That current could latch up a small negative charge pump such that the negative charge pump cannot provide the erase-mode signal.

Referring still to FIG. 3, the invert stage circuit 320 can comprise an invert-to-read-mode-signal circuit comprising a transistor 322 having a source coupled to the selection signal input 302, an inverted gate coupled to a ground, a bulk coupled to the source of transistor 322 and a drain coupled to the source of cascode transistor 324 such that the selection signal input 302 can be conducted to the drain of cascode transistor 324 via the channels of transistor 322 and cascode transistor 324 when the negative level shifter is coupled to a deselected block or an erase-mode voltage is not being applied to the output 340. A second cascode transistor 326 has a ringed drain coupled to the drain of cascode transistor 324, a gate coupled to the cascode input 304, a source coupled to a drain of transistor 328, and a bulk coupled to the bulk of transistor 328. Transistor 328 has a gate coupled to the drain of current source pull-down transistor 318, a source coupled to the negative charge pump input 308, and a bulk coupled to the negative charge pump input 308 such that the negative charge pump input 308 can be coupled to the ringed drain of the second cascode transistor 326 when a memory cell within the block coupled to the output 340 is selected to be erased.

Referring again to FIG. 3, the output stage circuit 330 may comprise an output-read-mode-signal circuit comprising a read-mode transistor 332 that is a triple well, long, n-channel transistor having a source coupled to a ground, a gate coupled to the ringed drain of the cascode transistor 324 in the invert stage 320, a drain coupled to the output 340, and a bulk coupled to the drain of read-mode transistor 332. The source of read-mode transistor 332 can conduct the ground to the output 340 via the channel of read-mode transistor 332 when the block coupled to the output 340 is deselected or the memory array containing the block is in a non-erase-mode, no memory cell in the memory array coupled to the output 340 is selected. The output stage circuit 330 can also comprise a triple well, n-channel cascode transistor 334 having a drain coupled to the output 340, a gate coupled to the cascode input 304, a source coupled to the source of an erase-mode transistor 336, and a bulk coupled to the bulk of the erase-mode transistor 336. The erase-mode transistor 336 has a gate coupled to the drain of the current source pull-down transistor 318 of the level shift stage circuit 310 and a bulk and source coupled to the negative charge pump input 308. The erase-mode transistor 336 is designed to couple the negative charge pump input 308 to the output 340 via the channel of the erase mode transistor 336 and the channel of the cascode transistor 334 when the negative level shifter is coupled to a selected block.

Alternate embodiments of the present invention comprise a transistor having a ringed drain in place of cascode transistor 324. Further embodiments that do not require erase-mode voltages of up to the approximately negative 12.5 volts may not require one or more of the cascode transistors 314, 316, 324, 326, and 334, dependent upon circuit stresses placed on the transistors or may be able to use double well, n-channel devices, as is well known to those of ordinary skill in the art. Further embodiments that may offer higher magnitude negative erase voltages may add cascode transistors such as between the source of read-mode transistor 332 and circuitry to provide substantially the same read-mode voltage as is provided. In some embodiments, the bias input 306 is not part of a current mirror circuit but is designed to maintain the current source pull-down transistor 318 on while transistors 322 and 324 are on such that there is no current from the negative charge pump input 308 to the selection signal input 302. Allowing a current between the negative charge pump input 308 and the selection signal input 302 can cause the negative charge pump to latch up. Latch up of the negative charge pump can occur when the current requirements to pull-down its output voltage is greater than the negative charge pump can output. Finally, the n-channel transistors may be substituted for the given p-channel transistors 312, 314, 322, and 324.

Referring now to FIG. 4, there is shown a system embodiment comprising a memory array controller 400 and a memory array 460 designed to store and retrieve data. The memory array controller 400 can be coupled to a data input/output 401, an address input/output 402, a read/write/erase input 404, a status output 405, a power input 406, and a ground input 408 to receive power and instructions to perform a read, program, or erasure of a memory cell 463, 465, 467, and 485 at the address in the memory array 460. The memory array controller 400 is designed to respond to the instructions and return a status via the status output 405. The memory array controller 400 may also return a value from the memory cell 463, 465, 467, and 485 via the data input/output 401 when the instruction was to read that memory cell. The memory array controller 400 comprises a negative charge pump 410, a block controller one 420, and a block controller two 440. The negative charge pump 410, is designed to supply power for requirements between zero volts and a negative voltage such as negative 15 volts. The negative charge pump 410 is coupled to a negative level shifter one 424 and a negative level shifter two 444. The block controller one 420 comprises a positive voltage switch one 422, the negative level shifter one 424, a bit line driver one 426, a word line driver one 428, and a word line driver two 430. The positive voltage switch one 422 can be designed to supply positive voltage power from zero volts to 15 volts for block controller one 420 and is coupled to negative level shifter one 424, bit line driver one 426, word line driver one 428, and word line driver two 430. The negative level shifter one 424 can be designed to supply a read-mode voltage or an erase-mode voltage depending upon the instructions received from the address input/output 402 and the read/write/erase input 404 via block controller one 420. The bit line driver one 426 may supply power to the bit lines of the memory cells in block one 462 of the memory array 460. The bit line driver one 426 can, for example, supply one volt from the positive voltage switch one 422 to the bit line 461 of memory cell 465 in block one 462 when an instruction is received to read memory cell 465. When an instruction is received by the memory array controller 400 to program memory cell 465, the bit line driver one 426 may supply seven volts to the bit line 461 of memory cell 465. The bit line driver one 426 can also float the bit line 479 when erasing memory cell 463. The word line driver one 428 may apply a gate voltage to memory cells attached to the word line 470 such as memory cell 463. The word line driver one 428 can supply, for example, five volts for reading, ten volts for programming, and negative twelve volts for erasing to word line 470. The word line driver two 430 can be designed to operate in substantially the same manner as word line driver one 428 when performing instructions on memory cells attached to the word line 471.

Referring still to FIG. 4, a block controller two 440 may be designed to perform instructions on memory cells in block two 466 of the memory array 460 in the same manner block controller one 420 performs instructions on memory cells in block one 462 of the memory array 460. The block controller two 440 can comprise a positive voltage switch two 442, the negative level shifter two 444, a bit line driver two 446, a word line driver three 448, and a word line driver four 450. The positive voltage switch two 442 is coupled to negative level shifter two 444, bit line driver two 446, word line driver three 448, and word line driver four 450. The negative level shifter two 444 is designed to supply a read-mode voltage or an erase-mode voltage depending upon the instructions received from the address input/output 402 and the read/write/erase input 404 via block controller two 440. The bit line driver two 446 can supply power to the bit lines of the memory cells in block two 466. The bit line driver two 446 can, for example, supply one volt from the positive voltage switch two 442 to the bit line 474 of memory cell 485 to read memory cell 485. The bit line driver two 446 may also supply seven volts to the bit line 474 to program memory cell 485 or float the bit line 474 to erase memory cell 485. The word line driver three 448 is designed to apply a gate voltage to memory cells attached to the word line 475 such as memory cell 467 and can supply, for example, five volts for reading, ten volts for programming, and negative twelve volts for erasing. The word line driver four 450 is designed to operate in substantially the same manner as word line driver one 428 when performing instructions on memory cells attached to the word line 476.

Block controller one 420 and block controller two 440 may also be designed to operate differently when one of them comprises a selected memory cell and the other does not. Further, word line driver one 428, word line driver two 430, word line driver three 448, and word line driver four 450 operate differently depending upon which driver is coupled to a selected memory cell. Typically, one word line or one block of memory cells may be selected for erasure at one time. For example, when instructions are received to erase a word line 470 comprising memory cell 463 in block one 462 of memory array 460, negative charge pump 410 may respond by transitioning the voltage coupled to negative level shifter one 424 and negative level shifter two 444 to an erase-mode voltage such as negative 12.5 volts. Negative level shifter one 424 can output the erase-mode voltage to word line driver one 428 and word line driver two 430. Negative to level shifter two 444 can output a read-mode voltage to word line driver three 448 and word line driver four 450. Word line driver one 428 can be coupled to memory cell 463 to apply the erase-mode voltage to the memory cell 463 via word line 470. At the same time, positive voltage switch one 422 may apply a positive voltage such as zero to three volts to the source line one 464 to remove the charge from the floating gate of memory cell 463. When zero volts is applied to the source line one 464, a memory cell 465 can be read since memory cell 465 is coupled to the word line driver two 430 via word line 471 but not coupled to the same bit line as memory cell 463. Memory cell 465 may be read by applying a positive one volt to the bit line 461 from the positive voltage switch one 422 via the bit line driver one 426 when word line driver two 430 outputs a positive voltage such as five volts from positive voltage switch one 422. On the other hand, in many embodiments, the positive voltage switch one 422 is not designed to output a positive five volts and zero volts during an erase operation for a read operation within block one 462, so a second memory cell 465 in block one 462 cannot be read when negative level shifter one 424 is outputting an erase-mode voltage. Further, negative level shifter two 444 in block controller two 440 is not coupled to a memory cell to be erased but may receive an erase-mode voltage from the negative charge pump 410. Thus, negative level shifter two 444 can output a read-mode voltage to block two 466 via word line drivers 446 and 448. Positive voltage switch two 442 can output a positive voltage such as five volts via word line driver three 448 and bit line driver two 446 can output a small positive voltage such as one volt so memory cell 467 in block two 466 can be read while memory cell 463 is being erased. Both memory cells 467 and 485 can be read while erasing memory cell 463, increasing the speed of the flash memory device since the erase operation is not interrupted by the read or vice versa.

Referring again to FIG. 4, the memory array controller 400 may receive an instruction to program or read memory cell 463. The negative charge pump 410 can supply zero volts to negative level shifter one 424 and negative level shifter two 444. Negative level shifter one 424 and negative level shifter two 444 output read-mode signals such as a low resistance, zero voltage current to word line driver one 428, word line driver two 430, word line driver three 448, and word line driver four 450. The block controller one 420 then applies voltages to program or read memory cell 463 via bit line driver one 426, word line driver one 428, and source line one 464. Word line driver two 430, word line driver three 448, and word line driver four 450, apply the read-mode signal to the gates of the memory cells attached to word lines 471, 475, and 476. A second instruction can be received to read memory cells 465, 467, and 485. In response to the second instruction, while the read or program is still being performed on memory cell 463, bit line driver one 426 can apply one volt to bit line 461 to read memory cell 465, block controller two 440 can apply zero volts to source line two 468, and bit line driver two 446 can apply one volt to bit lines 474 and 478 to read memory cells 467 and 485.

In many embodiments of the present invention, memory array 460 comprises more than two blocks and memory array controller 400 comprises a block controller for each block in memory array 460. The memory array controller 400, however, may have only negative charge pump 410 to supply power having voltages between zero volts and a negative voltage.

What is claimed is:

1. A method, comprising:
receiving a selection signal;
receiving an erase-mode signal;
determining a level-shifter signal from the selection signal and the erase mode signal;
determining an inverter signal from the level-shifter signal and the selection signal;
outputting the erase-mode signal in response to a first combination of the inverter signal and the level-shifter signal; and
outputting a read-mode signal in response to a second combination of the inverter signal and the level-shifter signal.

2. The method of claim 1, further comprising:
receiving a non-erase-mode signal; and
outputting the read-mode signal.

3. The method of claim 2, wherein outputting the read-mode signal comprises supplying a low impedance, low voltage current.

4. The method of claim 1, wherein said receiving a selection signal comprises combining a first signal and a second signal with a nand operation.

5. The method of claim 1, wherein said receiving an erase-mode signal comprises receiving an erase-mode signal having a negative voltage.

6. The method of claim 1, wherein said determining a level-shifter signal from the selection signal and the erase-mode signal comprises pulling up a voltage from a negative erase-mode voltage.

7. The method of claim 1, wherein said determining an inverter signal from the level-shifter signal and the selection signal comprises choosing between the level-shifter signal and the selection signal.

8. The method of claim 1, wherein said outputting the erase-mode signal in response to a first combination of the inverter signal and the level-shifter signal comprises outputting a negative erase-mode voltage in response to a positive voltage inverter signal and a negative voltage level-shifter signal.

9. The method of claim 1, wherein said outputting a read-mode signal in response to a second combination of the inverter signal and the level-shifter signal comprises outputting the read-mode signal in response to a negative voltage inverter signal and a negative voltage level-shifter signal.

10. An apparatus, comprising:
a level shift stage circuit to output a level-shifter signal based upon a selection signal input and a negative charge pump input;
an invert stage circuit to switch between the negative charge pump input and the selection signal input, based upon the selection signal input, to output as an inverter signal; and
an output stage circuit to switch between a read-mode signal and the negative charge pump input based upon the inverter signal and the level-shifter signal.

11. The apparatus of claim 10, wherein said level shift stage circuit comprises:
a current source pull-down circuit to output a level-shifter signal dependent upon the negative charge pump input; and
an active source pull-up circuit coupled to the current source pull-down circuit to modify the level-shifter signal based upon the selection signal input.

12. The apparatus of claim 11, wherein the current source pull-down circuit comprises:
a first transistor having a gate coupled to a bias input and a source/drain coupled to the negative charge pump input; and
a first cascode transistor having a source/drain coupled a drain/source of the first transistor, and a gate coupled to a cascode input.

13. The apparatus of claim 11, wherein the active source pull-up circuit comprises:
a second transistor having a source/drain coupled to a pull-up input and a gate coupled to the selection signal input; and
a second cascode transistor having a source/drain coupled to a drain/source of the second transistor, a drain/source coupled to the current source pull-down circuit, and a gate coupled to a cascode input.

14. The apparatus of claim 11, wherein the current pull-down circuit comprises a triple-well, n-channel, insulated gate transistor.

15. The apparatus of claim 11, wherein the active pull-up circuit comprises a p-channel transistor.

16. The apparatus of claim 10, wherein said invert stage circuit comprises:
an invert-to-read-mode-signal circuit; and
an invert-to-erase-mode-signal circuit coupled to the invert-to-read-mode-signal circuit to output the inverter signal.

17. The apparatus of claim 16, wherein the invert-to-read-mode-signal circuit comprises:
a third transistor having a source/drain coupled to the selection signal input and a gate coupled to a circuit ground; and
a third cascode transistor having a source/drain coupled to a drain/source of the third transistor, a drain/source coupled to the invert-to-erase-mode-signal circuit, and a gate coupled to the cascode input.

18. The apparatus of claim 16, wherein the invert-to-erase-mode-signal circuit comprises:
   a fourth transistor having a source/drain coupled to the negative charge pump input and a gate coupled to said level shift stage circuit; and
   a fourth cascode transistor having a source/drain coupled to a drain/source of the fourth transistor, a drain/source coupled to the drain/source of the third cascode transistor, and a gate coupled to the cascode input.

19. The apparatus of claim 10, wherein said output stage circuit comprises:
   an output-read-mode-signal circuit to couple the read-mode signal to the output based upon the inverter signal; and
   an output-erase-mode-signal circuit to couple the negative charge pump input to the output based upon the level-shifter signal.

20. The apparatus of claim 19, wherein the output-read-mode-signal circuit comprises a fifth transistor having a source/drain coupled to the circuit ground, a gate coupled to said invert stage circuit, and a drain/source coupled to the output.

21. The apparatus of claim 20, wherein the fifth transistor comprises a low resistance channel.

22. The apparatus of claim 19, wherein the output-erase-mode-signal circuit comprises:
   a sixth transistor having a source/drain coupled to the negative charge pump input, and a gate coupled to said invert stage circuit; and
   a sixth cascode transistor having a source/drain coupled to a drain/source of the sixth transistor, a gate coupled to a cascode input, and a drain/source coupled to the output.

23. The apparatus of claim 10, wherein said level shift stage circuit comprises a transistor having a ringed drain/source.

24. The apparatus of claim 10, wherein the negative charge pump input comprises a high magnitude negative voltage.

25. An apparatus, comprising:
   a pull-up transistor having a gate coupled to a selection signal;
   a pull-down transistor coupled to said pull-up transistor, having a gate coupled to a bias input and a source/drain coupled to a negative charge pump;
   a first transistor having a drain/source coupled to the selection signal;
   a second transistor coupled to said first transistor, having a gate coupled to a drain/source of said pull-down transistor and a source/drain coupled to the negative charge pump;
   a read-mode transistor having a source/drain coupled to an output; and
   an erase-mode transistor having a drain/source coupled to the output and a source/drain coupled to the negative charge pump.

26. The apparatus of claim 25, wherein a source drain of said pull-up transistor is coupled to the drain/source of said pull-down transistor via a cascode transistor.

27. The apparatus of claim 25, wherein a drain/source of said second transistor is coupled to a source/drain of said first transistor via a cascode transistor.

28. A system, comprising:
   a pull-up transistor having a gate coupled to a selection signal;
   a pulldown transistor coupled to said pull-up transistor, having a gate coupled to a bias input and a source/drain coupled to a negative charge pump;
   a first transistor having a drain/source coupled to the selection signal;
   a second transistor coupled to said first transistor, having a gate coupled to a drain/source of said pull-down transistor and a source/drain coupled to the negative charge pump;
   a read-mode transistor having a source/drain coupled to an output;
   an erase-mode transistor having a drain/source coupled to the output and a source/drain coupled to the negative charge pump; and
   a memory cell coupled to the output.

29. The system of claim 28, wherein said memory cell comprises a transistor to store a charge.

30. The system of claim 28, wherein said erase-mode transistor is coupled to the output via a cascode transistor.

* * * * *